United States Patent [19]
Yamasaki et al.

[11] Patent Number: 5,953,581
[45] Date of Patent: Sep. 14, 1999

[54] METHODS FOR MANUFACTURING GROUP III NITRIDE COMPOUND SEMICONDUCTOR LASER DIODES

[75] Inventors: Shiro Yamasaki; Seiji Nagai; Masayoshi Koike, all of Aichi-ken, Japan

[73] Assignee: Toyoda Gosei Co., Ltd., Aiehi-ken, Japan

[21] Appl. No.: 08/840,895

[22] Filed: Apr. 17, 1997

[30] Foreign Application Priority Data

Apr. 17, 1996 [JP] Japan .................................. 8-120905

[51] Int. Cl.$^6$ ................................................... H01L 21/66
[52] U.S. Cl. ................................................................ 438/22
[58] Field of Search .............................. 438/22, 38, 694, 438/958; 148/DIG. 65

[56] References Cited

U.S. PATENT DOCUMENTS

| | | | |
|---|---|---|---|
| 4,468,850 | 9/1984 | Liau et al. | 29/569 |
| 5,177,031 | 1/1993 | Buchmann et al. | 438/38 |
| 5,319,725 | 6/1994 | Buchmann et al. | 385/14 |

OTHER PUBLICATIONS

Nakamura et al. "InGaN Multi–Quantum–Well–Structure Laser Diodes", Japanese Journal of Applied Physics. vol. 35, 1996, pp. L217–220.

*Primary Examiner*—Chandra Chaudhari
*Assistant Examiner*—Craig Thompson
*Attorney, Agent, or Firm*—Pillsbury Madison & Sutro LLP

[57] ABSTRACT

As a method for manufacturing a laser diode using a group III nitride compound semiconductor, independent dry etching process for forming electrodes and mirror facets are adopted. A portion of an upper semiconductor layer is etched for forming a window. An electrode for a lower semiconductor layer is formed through the window. After electrodes are formed, then, etching is carried out for forming mirror facets of laser cavity. This method realizes high oscillation, because the method enhances parallel and vertical degrees of the mirror facets. Further, cleanness of the mirror facets are improved, because they are formed after the electrodes are formed. The method further lowers resistivity of lower semiconductor layer, because its thickness can be controlled easily without etching excessively. As a result, luminous efficiency is improved.

5 Claims, 4 Drawing Sheets

F I G. 1
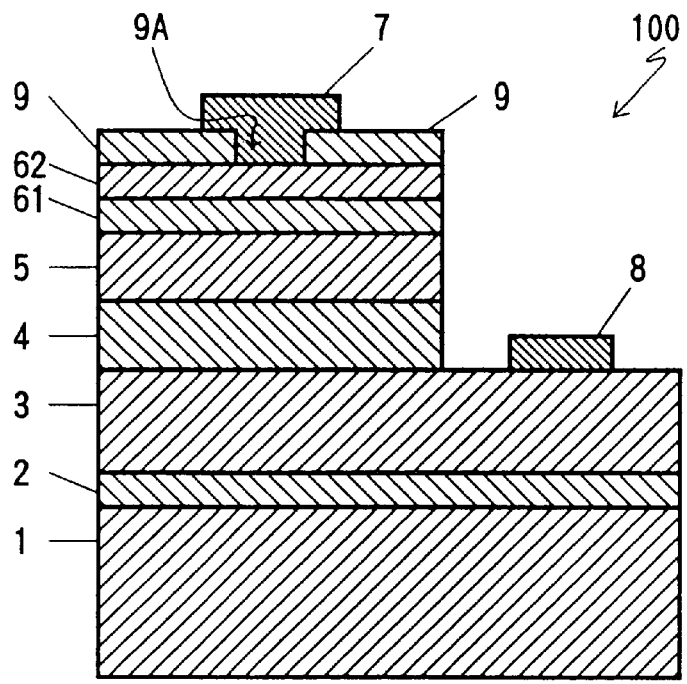
F I G. 2
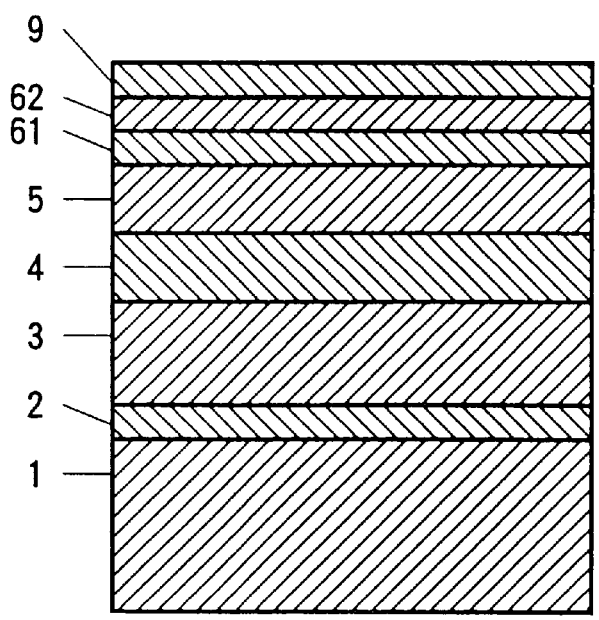

METHODS FOR MANUFACTURING GROUP III NITRIDE COMPOUND SEMICONDUCTOR LASER DIODES

BACKGROUND OF THE INVENTION

1. Field of the Invention

The present invention relates to a method for manufacturing a group III nitride compound semiconductor laser diode (LD hereinafter) that emits visible short wave rays in the blue region. In particular, the invention relates to a method for forming mirror facets of the LD for better laser cavity.

2. Description of the Related Art

It has been known that a conventional light-emitting device such as a light-emitting diode (LED) and an LD which emits blue light includes a sapphire substrate and group III nitride compound semiconductor layers such as AlGaInN formed thereon. In order to improve reflection and oscillation efficiency of the LD, vertical and parallel degrees of its mirror facets of laser cavity are required to be high. Cleavage is a method for that purpose. It is, however, difficult to cleave the LD formed on the sapphire substrate, because the LD is made of heterogeneous materials. Namely, axis A of the sapphire substrate and that of GaN semiconductor layers formed thereon are discrete to each other and cleavage plane results in uneven and bumpy surface. Accordingly, dry etching is used as an alternate.

Conventionally, a dry etching process is being used both for forming a window for an electrode to insulate an upper and a lower semiconductor layers and for forming mirror facets of laser cavity at a time. The electrodes are inevitably formed on the same side of a sapphire substrate, because the sapphire substrate has an insulative characteristic and a pair of electrodes are required to be formed on the side of semiconductor layers. One electrode is formed on an uppermost semiconductor layer of the LD and another is in contact with some portion of a lower semiconductor layer through a window formed by dry etching.

Dry etching, however, which proceeds in knife shape or tapered shape raises a problem. So as to obtain high vertical and parallel degrees of the mirror facets, the semiconductor layers have to be etched deeply even after dry etching for forming a window is enough. Namely, the dry etching process have to be proceeded further even after a window with depth enough for an electrode is obtained. Accordingly, the lower layer is etched excessively and becomes thinner. As a result, its resistivity and driving voltage increase and luminous efficiency of the LD drops. Further, since a pair of electrodes are formed after the mirror facets are formed, unnecessary materials attach to the mirror facets of the LD during the process of electrodes formation.

SUMMARY OF THE INVENTION

It is therefore an object of the present invention to control depth of dry etching independently for improving luminous efficiency of an LD, improving verticality of mirror facets of laser cavity, improving purity of the mirror facets, and suppressing resistivity of the lower layer.

According to the first aspect of the invention, there is provided a method for manufacturing a laser diode at least having a p-layer and an n-layer made of a group III nitride compound semiconductor on a substrate, the method constituted by the steps of forming semiconductor layers at least including the p-layer and the n-layer on the substrate, the semiconductor layers being made of group III nitride compound, etching a portion of the semiconductor layers until surface of a lowermost layer among the semiconductor layers is exposed, forming a first electrode layer on an uppermost layer among the semiconductor layers and a second electrode layer on exposed surface of the lowermost layer, and etching sides of the semiconductor layers in perpendicular direction to length of laser cavity so as to form mirror facets.

The semiconductor layers satisfy the formula $Al_xGa_yIn_{1-x-y}N$ wherein $0 \leq x \leq 1$, $0 \leq y \leq 1$, and $0 \leq x+y \leq 1$. The substrate is a material with an insulative characteristic such as $Si_2O_3$, SiC, and Si. Further preferably, the semiconductor layers includes a cladding layer of $Al_xGa_{1-x}N$ and an active layer of $In_xGa_{1-x}N$.

In the present invention, etching process for forming a window for an electrode in contact with the lower semiconductor layer and that for forming mirror facets of laser cavity are proceeded separately. Accordingly, depth of dry etching can be controlled independently. The dry etching process for forming the window is completed when a surface of the lower layer appears. The dry etching process for forming the mirror facets is carried out till necessary vertical and parallel degree is obtained. Since the substrate is diced in parallel to the mirror facets, the lower semiconductor layer may be thin in the parallel sides of the mirror facets. Accordingly, the thickness of the lower semiconductor layer can be maintained in the perpendicular sides of the mirror facets as it is formed and resistivity of the lower layer can be suppressed. Consequently, driving voltage is lowered and luminous efficiency is improved.

Further, cleanness of the mirror facets increases, because electrodes are deposited before the mirror facets are formed by dry etching. Even unnecessary materials attache to side facets when the electrodes are formed, they are removed by the etching process for forming the mirror facets. As a result, luminous efficiency is improved.

Other objects, features, and characteristics of the present invention will become apparent upon consideration of the following description in the appended claims with reference to the accompanying drawings, all of which form a part of the specification, and wherein referenced numerals designate corresponding parts in the various figures.

BRIEF DESCRIPTION OF THE DRAWING

In the accompanying drawings:

FIG. 1 is a front elevation illustrating the structure of an LD in the example set forth below; and FIGS. 2 to 5 are sectional views illustrating successive steps of manufacturing the LD;

DETAILED DESCRIPTION OF THE PREFERRED EMBODIMENT

Figure 3:
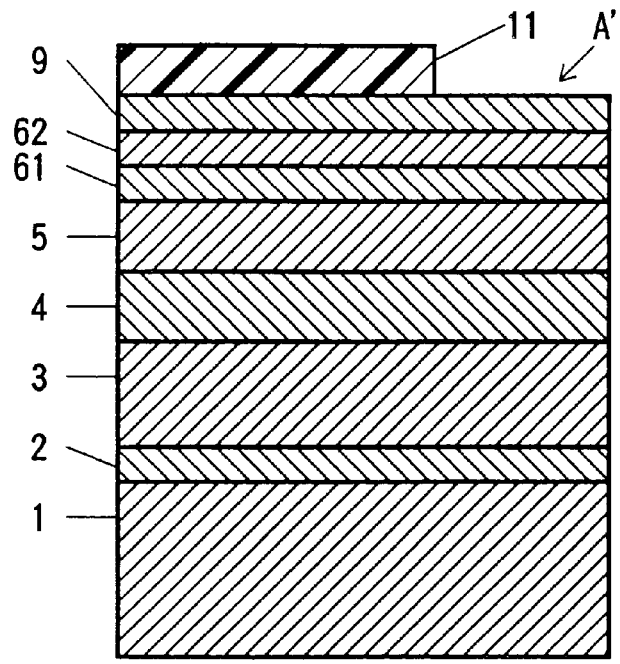

The invention will be more fully understood by reference to the following embodiment, but not limited thereto.

EXAMPLE 1

As shown in FIG. 1, an LD 100 has a sapphire substrate 1 on which about 500 Å in thickness of aluminum nitride (AlN) buffer layer 2 is formed. Six layers are consecutively formed on the AlN buffer layer 2: about 2.2

μm in thickness of silicon (Si) doped gallium nitride (GaN) layer 3 of n$^+$-type, having an electron concentration of $2 \times 10^{18}/cm^3$ and having an Si concentration of $4 \times 10^{18}/cm^3$; about 1.0 μm in thickness of Si-doped $Al_{0.08}Ga_{0.92}N$ layer 4 of n-type, having an electron concentration of $2 \times 10^{18}/cm^3$ and having an Si concentration of $4 \times 10^{18}/cm^3$; about 0.05 μm in thickness of $In_{0.08}Ga_{0.92}N$ active layer 5; about 1.0 μm in thickness of magnesium (Mg) doped $Al_{0.08}Ga_{0.92}N$ cladding layer 61 of p-type, having a hole concentration of $5 \times 10^{17}/cm^3$ and having an Mg concentration of $1 \times 10^{20}/cm^3$; about a 0.2 μm in thickness of Mg-doped GaN contact layer 62, having hole concentration of $7 \times 10^{17}/cm^3$ and having Mg concentration of $2 \times 10^{20}/cm^3$; and a $SiO_2$ layer 9. The $SiO_2$ layer has a window 9A through which an electrode layer 7 made of Ni is formed in contact with the contact layer 62. A electrode layer 8 made of Ni is formed on some portion of the n$^+$-layer 3.

A method for manufacturing the LD 100 is explained hereinafter. Each of the semiconductor layers, from the buffer layer 2 to the contact layer 62, were formed on the sapphire substrate 1 by gaseous phase epitaxial growth, called metal organic vapor phase deposition (hereinafter MOVPE).

The gases employed in this process are ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 1 has a thickness of about 100 μm to 400 μm. After its main surface 'a' was cleaned by an organic washing solvent and heat treatment, the sapphire substrate 1 was placed on a susceptor in a reaction chamber for the MOVPE treatment. Then the sapphire substrate 1 was baked at 1100° C. by $H_2$ vapor fed into the chamber at a flow rate of 2 liter/min. under normal pressure.

About 500 Å in thickness of AlN buffer layer 2 was formed on the surface 'a' of the baked sapphire substrate 1 under conditions controlled by lowering the temperature in the chamber to 400° C., keeping the temperature constant, and concurrently supplying $H_2$ at a flow rate of 20 liter/min., $NH_3$ at 10 liter/min., and TMA at $1.8 \times 10^{-5}$ mol/min.

About 2.2 μm in thickness of Si-doped GaN was formed on the buffer layer 2, as an n$^+$-layer 3 of high carrier concentration with a Si concentration of about $4 \times 10^{18}/cm^3$ and an electron concentration of about $2 \times 10^{18}/cm^3$, under conditions controlled by keeping the temperature of the sapphire substrate 1 at 1150° C. and concurrently supplying for 30 min. $H_2$ at a flow rate of 20 liter/min., $NH_3$ at 10 liter/min., TMG at $1.7 \times 10^{-4}$ mol/min., and silane diluted to 0.86 ppm by $H_2$ at 200 ml/min.

About 1 μm in thickness of Si-doped $Al_{0.08}Ga_{0.92}N$ was formed on the n$^+$-layer 3, as an n-type cladding layer 4 with a Si concentration of about $4 \times 10^{18}/cm^3$ and an electron concentration of about $2 \times 10^{18}/cm^3$, under conditions controlled by keeping the temperature of the sapphire substrate 1 at 1100° C. and concurrently supplying for 60 min. $N_2$ or $H_2$ at a flow rate of 10 liter/min., $NH_3$ at 10 liter/min., TMG at $1.12 \times 10^{-4}$ mol/min., TMA at $0.47 \times 10^{-4}$ mol/min., and silane diluted to 0.86 ppm by $H_2$ at $10 \times 10^{-9}$ mol/min.

About 0.05 μm in thickness of $In_{0.08}Ga_{0.92}N$ was formed on the n-type cladding layer 4 as active layer 5 under conditions controlled by keeping the temperature of the sapphire substrate 1 at 850° C. and concurrently supplying for 6 min. $N_2$ or $H_2$ at a flow rate of 20 liter/min., $NH_3$ at 10 liter/min., TMG at $1.53 \times 10^{-4}$ mol/min., and TMI at $0.02 \times 10^{-4}$ mol/min.

About 1.0 μm in thickness of Mg-doped $Al_{0.08}Ga_{0.92}N$, serving as a p-type cladding layer 61, was formed on the active layer 5 under conditions controlled by keeping the temperature of the sapphire substrate 1 at 1100° C. and concurrently supplying for 60 min. $N_2$ or $H_2$ at a flow rate of 20 liter/min., $NH_3$ at 10 liter/min., TMG at $1.12 \times 10^{-4}$ mol/min., TMA at $0.47 \times 10^{-4}$ mol/min., and $CP_2Mg$ at $2 \times 10^{-4}$ mol/min. The impurity concentration of Mg-doped into the cladding layer 61 was $1 \times 10^{20}/cm^3$. The resistivity of the cladding layer 61 was $10^8$ Ω·cm or more, exhibiting insulating characteristics.

About 0.2 μm in thickness of Mg-doped GaN, serving as a contact layer 62, was formed on the cladding layer 61 under conditions of keeping the temperature of the sapphire substrate 1 at 1100° C. and concurrently supplying for 4 min. $N_2$ or $H_2$ at a flow rate of 20 liter/min., $NH_3$ at 10 liter/min., TMG at $1.12 \times 10^{-4}$ mol/min., and $CP_2Mg$ at $4 \times 10^{-4}$ mol/min. The impurity concentration of Mg doped into the contact layer 62 was $2 \times 10^{20}/cm^3$. The resistivity of the contact layer 62 was $10^8$ Ω·cm or more, exhibiting insulating characteristics.

Then, electron rays were uniformly irradiated into the contact layer 62 and the cladding layer 61 using a reflective electron beam diffraction device. The irradiation conditions were set at 10 kV for the accelerating voltage, 1 μA for the sample current, 0.2 mm/sec. for the speed of the beam scanning, 60 μmΦ for the beam aperture, and at $5.0 \times 10^{-5}$ Torr vacuum. This irradiation changed the insulative two layers, the contact layer 62 and the cladding layer 61, to each be a p-type conductive semiconductor with respective hole concentrations of $7 \times 10^{17}/cm^3$ and $5 \times 10^{17}$ and respective resistivities of 2 Ω·cm and 0.8 Ω·cm. As a result, a wafer with a multiple layer structure was obtained.

Then, as shown in FIG. 2, about 2000 Å in thickness of $SiO_2$ layer 9 was formed on the contact layer 62 by sputtering. A photoresist layer 11 was formed on the $SiO_2$ layer 9. As shown in FIG. 3, a portion of the photoresist layer 11 where an electrode layer 8 is formed for the n$^+$-layer 3 was removed by photolithography. The exposed portion of the $SiO_2$ layer 9 which is an uncovered portion A' with the photoresist layer 11 was etched off by use of an acid etching liquid.

Figure 4:
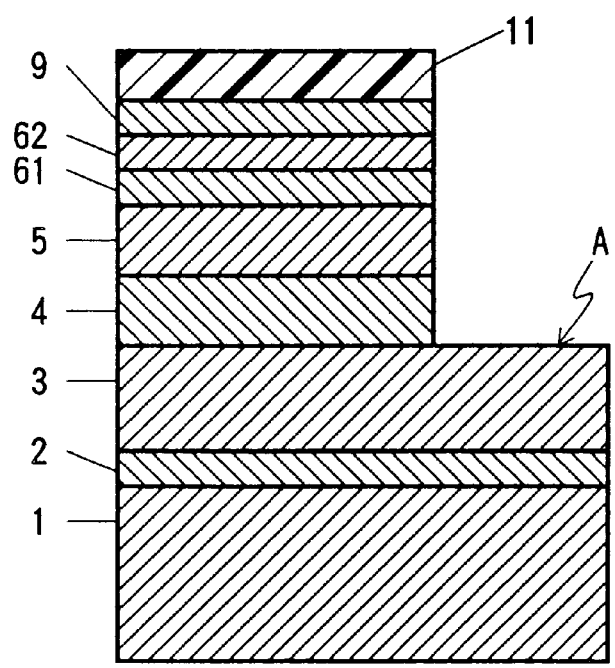

Utilizing the remaining photoresist layer 11 and $SiO_2$ layer 9 as a mask, the uncovered portion A with the photoresist layer 11, or the exposed portion of the layers from the contact layer 62 down to the cladding layer 4, were etched off by dry etching, or supplying a high-frequency power density of 0.44 W/cm$^2$ and $BCl_3$ gas of 10 ml/min. at a vacuum degree of 0.04 Torr as shown in FIG. 4. After that, dry etching with argon (Ar) was carried out onto the wafer. Consequently, a window A for forming an electrode reaching the n$^+$-layer 3 of high carrier concentration was formed.

Figure 5:
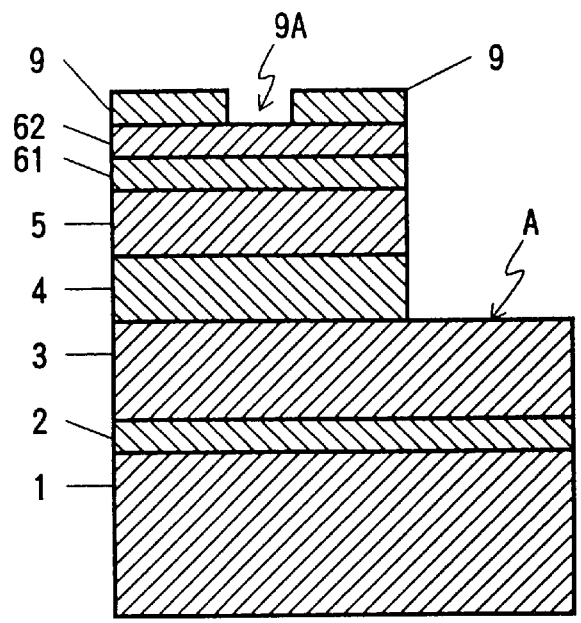

As shown in FIG. 5, a window 9A is formed where an electrode 7 for the contact layer 62 is formed through the processes of laminating a photoresist layer on the remaining $SiO_2$ layer 9, patterning by photolithography, and carrying out wet etching.

Figure 6:
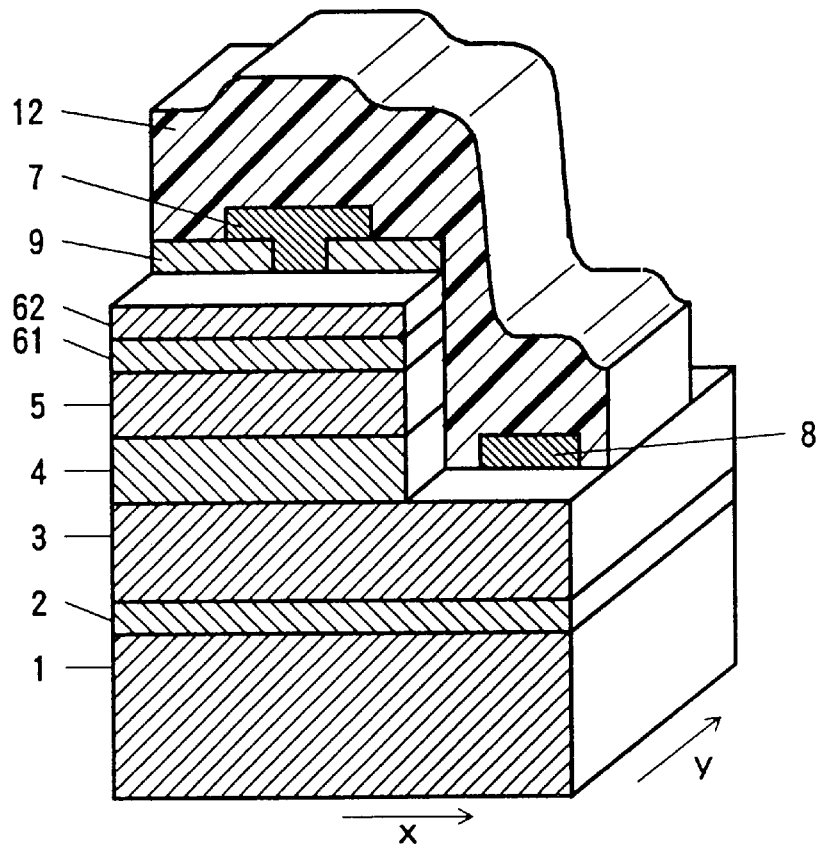
FIG. 6 is a perspective view illustrating a step of manufacturing the LD.

Then, as shown in FIG. 6, electrode layers 8 and 7 respective for the n$^+$-layer 3 of high carrier concentration and the contact layer 62 were formed through processes of uniformly depositing a Ni layer on the entire wafer, laminating a photoresist layer, patterning by photolithography, and removing the photoresist and some portion of the Ni layer by etching.

A dry etching process was carried out for forming mirror facets S of laser cavity as follows.

A photoresist layer 12 was formed over the entire surface of the element. Photolithography etched out some portion of the photoresist layer 12 whose remaining part had a width as wide as the element in the direction of axis x and a length as long as the laser cavity in the direction of axis y. As a result, an element covered with the photoresist layer 12 was obtained as shown in FIG. 6.

Figure 7:
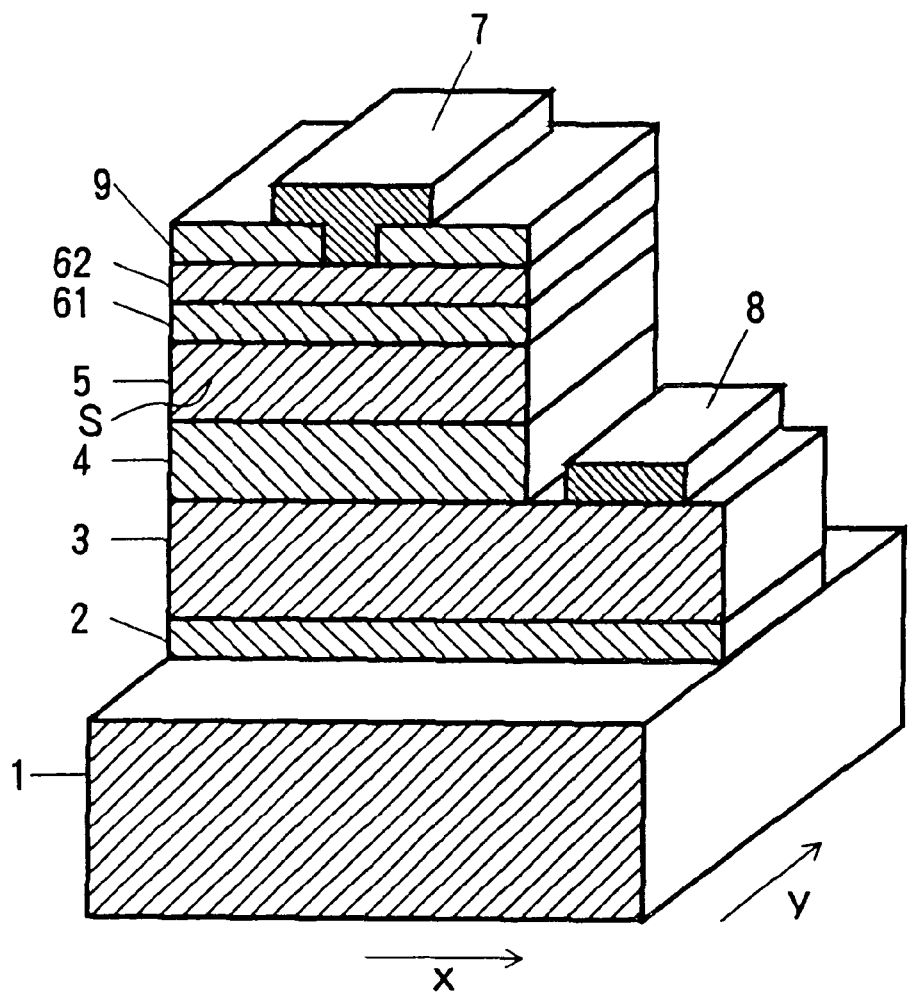
FIG. 7 is a perspective view illustrating the structure of the LD.

Then, dry etching for forming the mirror facets was carried out till the surface of the sapphire substrate 1 appeared under conditions controlled by supplying a high-frequency power density of 0.44 W/cm$^2$ and BCl$_3$ gas of 10 ml/min. at a vacuum degree of 0.04 Torr. The remaining photoresist layer 12 was removed. FIG. 7 shows the obtained mirror facets S of laser cavity with high degree of verticality to the sapphire substrate 1 and with high parallel degree to each other.

The mirror facets S were coated with SiO$_2$ deposited by sputtering for surface protection.

A wafer treated with the above-mentioned process was scribed along the direction of the axis x and divided into rectangular shaped wafers along the direction of length of the laser cavity, or the axis y, by dicing. After breaking the rectangular shaped wafers by applying a load, a chip of the LED 100 as shown in FIG. 1 was obtained.

The obtained LD 100 was found to have an output power of 10 mW and an oscillation wavelength of 380 nm by driving current of 1000 mA.

In the embodiment, the active layer 5 was made of In$_{0.08}$Ga$_{0.92}$N and the cladding layers 4 and 61 were made of Al$_{0.08}$Ga$_{0.92}$N. Alternatively, any binary, ternary, and quaternary compounds can be used as far as it satisfies Al$_x$Ga$_y$In$_{1-x-y}$N wherein $0 \leq x \leq 1$, $0 \leq y \leq 1$, and $0 \leq x+y \leq 1$. When the active layer 5 and the cladding layers 4 and 61 are formed to have a double hetero junction, composition ratio of the layers 5, 4, and, 61 are designed so that bandgap of each of the cladding layers 4 and 61 is wider than that of the active layer 5 and each of their lattice constant meets to that of the active layer 5. Further, when quaternary compound of Group III nitride compound semiconductor is used, a double hetero junction whose lattice constant of each of the layers 5, 4, and 61 meet to each other can be realized, because bandgap and lattice constant can be determined independently. Although a double hetero junction structure is the most desirable, the present invention is not limited thereto. Other variations such as a single hetero junction structure and homo junction structure can be used, alternately. Further, a multi-quantum well (MQW) structure and a single-quantum well (SQW) structure can be used for the active layer 5.

SiO$_2$ was used as an etching mask during the process of forming the electrode 8 in the embodiment. Alternatively, any materials, including a metal and a resist, can be used on condition that they can resist dry etching, allow selective etching of gallium nitride semiconductor thereunder, and be easily peeled off. Further, photoresist was used during etching processes for forming the mirror facets S of laser cavity in the embodiment. Alternatively, the any materials including SiO$_2$ can be used on condition that they can resist dry etching, allow selective etching of electrodes 7 and 8 thereunder, and be easily peeled off.

In the embodiment, dry etching was used for forming the electrodes. Wet etching can be used as an alternate. Further, reactive ion beam etching (RIBE) is preferable as the dry etching for forming the mirror facets of laser cavity.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method for manufacturing a laser diode at least having a p-layer and an n-layer made of a group III nitride compound semiconductor on a substrate, said method comprising:

forming semiconductor layers at least including said p-layer and said n-layer on said substrate, said semiconductor layers being made of group III nitride compound;

etching a portion of said semiconductor layers until surface of a lowermost layer among said semiconductor layers is exposed;

forming a first electrode layer on an uppermost layer among said semiconductor layers and a second electrode layer on exposed surface of said lowermost layer; and etching sides of said semiconductor layers in perpendicular direction to length of laser cavity so as to form mirror facets.

2. A method of claim 1, wherein said semiconductor layers satisfy the formula Al$_x$Ga$_y$In$_{1-x-y}$N where $1 \leq x \leq 1$, $0 \leq y \leq 1$, and $0 \leq x+y \leq 1$.

3. A method of claim 1, wherein said substrate has an insulative characteristic.

4. A method of claim 1, wherein said substrate is sapphire (Al$_2$O$_3$).

5. A method of claim 1, wherein said semiconductor layers includes a cladding layer of Al$_x$Ga$_{1-x}$N and an active layer of In$_x$Ga$_{1-x}$N.

* * * * *

UNITED STATES PATENT AND TRADEMARK OFFICE
CERTIFICATE OF CORRECTION

PATENT NO. : 5,953,581
DATED : September 14, 1999
INVENTOR(S) : Shiro Yamasaki; Seiji Nagai and Masayoshi Koike It is certified that error appears in the above-identified patent and that said Letters Patent is hereby corrected as shown below:

<u>Title page:</u>
[73] Assignee: Toyoda Gosei Co., Ltd., Aichi-ken, Japan and Japan Science and Technology Corporation, Kawaguchi-shi, Saitama-Ken, Japan Signed and Sealed this Twenty-eighth Day of August, 2001

Attest:

*Nicholas P. Godici*

NICHOLAS P. GODICI
*Attesting Officer*     *Acting Director of the United States Patent and Trademark Office*